(12) United States Patent
Lee

(10) Patent No.: US 8,153,493 B2
(45) Date of Patent: Apr. 10, 2012

(54) FINFET PROCESS COMPATIBLE NATIVE TRANSISTOR

(75) Inventor: Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 253 days.

(21) Appl. No.: 12/267,121

(22) Filed: Nov. 7, 2008

(65) Prior Publication Data
US 2010/0052059 A1   Mar. 4, 2010

Related U.S. Application Data

(60) Provisional application No. 61/092,510, filed on Aug. 28, 2008.

(51) Int. Cl.
*H01L 21/336* (2006.01)
(52) U.S. Cl. ............. 438/294; 257/E21.409
(58) Field of Classification Search .......... 438/197, 438/284, 294; 257/E21.409, E21.562, E21.571, 257/E21.426, 347, 401
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,105,934 B2* | 9/2006 | Anderson et al. | 257/213 |
| 7,190,050 B2 | 3/2007 | King et al. | |
| 7,247,887 B2 | 7/2007 | King et al. | |
| 7,265,008 B2 | 9/2007 | King et al. | |
| 7,407,847 B2* | 8/2008 | Doyle et al. | 438/164 |
| 7,508,031 B2 | 3/2009 | Liu et al. | |
| 7,528,465 B2 | 5/2009 | King et al. | |
| 7,535,061 B2* | 5/2009 | Lee et al. | 257/347 |
| 7,560,785 B2* | 7/2009 | Yu et al. | 257/401 |
| 7,605,449 B2 | 10/2009 | Liu et al. | |
| 7,687,364 B2* | 3/2010 | Sell | 438/303 |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1* | 5/2007 | Liu et al. | 438/187 |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2008/0124893 A1* | 5/2008 | Kim et al. | 438/426 |
| 2008/0258228 A1 | 10/2008 | Chuang et al. | |
| 2008/0263492 A1 | 10/2008 | Chuang et al. | |
| 2008/0290470 A1 | 11/2008 | King et al. | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — William D Coleman
*Assistant Examiner* — Christine Enad
(74) *Attorney, Agent, or Firm* — Haynes and Boone, LLP

(57) ABSTRACT

Provided is a top-channel only finFET device. The methods and devices described herein may provide a native device that is compatible with a finFET process flow. A gate may be formed on the top of a fin providing the channel region of the device. In an embodiment, the gate is provided only on one side of the channel, for example, on the top of the fin. The sidewalls of the fin including channel may abut an isolation structure. In an embodiment, isolation structures are formed between the fins to provide a planar surface for the formation of a gate.

15 Claims, 13 Drawing Sheets

U.S. PATENT DOCUMENTS

| | | | |
|---|---|---|---|
| 2008/0296632 A1 | 12/2008 | Moroz et al. | |
| 2009/0035909 A1 | 2/2009 | Chang et al. | |
| 2009/0181477 A1 | 7/2009 | King et al. | |
| 2009/0302372 A1* | 12/2009 | Chang et al. | 257/327 |
| 2010/0006945 A1 | 1/2010 | Merelle et al. | |
| 2010/0006974 A1 | 1/2010 | Xu et al. | |
| 2010/0183961 A1 | 7/2010 | Shieh et al. | |
| 2010/0203734 A1 | 8/2010 | Shieh et al. | |
| 2010/0264468 A1 | 10/2010 | Xu | |

OTHER PUBLICATIONS

Hsien-Hsin Lin, et al., U.S. Appl. No. 12/703,918, "Method for Fabricating A Finfet Device," filed Feb. 11, 2010, 40 pages.

Chien-Chang Su, et al., U.S. Appl. No. 12/644,869, "Method for Incorporating Impurity Element In EPI Silicon Process," filed Dec. 22, 2009, 21 pages.

Tsung-Lin Lee, et al., U.S. Appl. No. 12/622,038, "Sacrificial Offset Protection Film For A Finfet Device," filed Nov. 19, 2009, 56 pages.

Jeff J. Xu, et al., U.S. Appl. No. 12/784,207, "Method of Forming EPI Film In Substrate Trench," filed May 20, 2010, 33 pages.

Tian-Choy, et al., U.S. Appl. No. 12/756,552, "Hybrid Gate Process For Fabricating Finfet Device," filed Apr. 8, 2010, 38 pages.

Ming-Lung Cheng, et al. U.S. Appl. No. 12/780,124, "Method And Apparatus For Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit For Finfet Devices," filed Jun. 30, 2010, 32 pages.

Jhon Jhy Liaw, U.S. Appl. No. 12/823,860, "Structure And Method For SRAM Cell Circuit," filed Jun. 25, 2010, 37 pages.

Jhon Jhy Liaw, et al., U.S. Appl. No. 12/827,690, "Layout For Multiple-Fin SRAM Cell," filed Jun. 30, 2010, 35 pages.

Jeng-Jung Shen, et al., U.S. Appl. No. 12/780,060, "Automatic Layout Conversion For Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl No. 12/840,830, "High Surface Dopant Concentration Semiconductor Device And Method Of Fabricating," filed Jul. 21, 2010, 21 pages.

Peng-Soon Lim, et al., U.S. Appl. No. 12/827,512, "Gate Structures And Method Of Fabricating Same," filed Jun. 30, 2010, 41 pages.

Tsu-Hsiu Perng, et al., U.S. Appl. No. 12/837,093, "Fin-Like Field Effect Transistor (Finfet) Device And Method Of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor On Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device And Method Of Manufacturing Same," filed Oct. 18, 2010, 55 pages.

Jeff J. Csu, et al, U.S. Appl. No. 12/917,902, "Fin-Like Field Effect Transistor (FINFET) Device And Method Of Manufacturing Same," filed Nov. 2, 2010, 61 pages.

Mark van Dal, U.S. Appl. No. 12/900,895, "Method Of Fabricating A Semiconductor Device Having An Epitaxly Region," filed Oct. 8, 2010, 21 pages.

Hsin-Chih Chen, et al, U.S. Appl. No. 12/907,272, "Multi-Fin Device By Self-Aligned Castle Fin Formation," filed Oct. 19, 2010, 34 pages.

Chien-Hsun Wang, et al, U.S. Appl. No. 12/952,376, "Method For Adjusting Fin Width In Integrated Circuitry," filed Nov. 23, 2010, 27 pages.

Chien-Shun Wang, et al, U.S. Appl. No. 12/949,881, "Method for Forming Metrology Structures From Fins In Integrated Circuitry," filed Nov. 19, 2010, 16 pages.

Chien-Hsun Wang, et al, U.S. Appl. No. 12/953,148, "Device And Method For Forming Fins In Integrated Circuitry," filed Nov. 23, 2010, 39 pages.

* cited by examiner

FINFET PROCESS COMPATIBLE NATIVE TRANSISTOR

PRIORITY DATA

This application claims priority to Provisional Application Ser. No. 61/092,510, filed on Aug. 28, 2008, entitled "FIN-FET PROCESS COMPATIBLE NATIVE TRANSISTOR," the entire disclosure of which is incorporated herein by reference.

BACKGROUND

The present disclosure relates generally to an integrated circuit device and, more particularly, to a native transistor (e.g., nMOSFET) and method of fabrication of a device using a finFET compatible process.

As technology progresses, the desire to create smaller integrated circuit devices increases. For example, the semiconductor industry ardently strives to decrease the size of memory cells. One strategy that has been employed includes the use of multiple gate transistors, otherwise known as Fin-FETs. A typical finFET device is fabricated using a silicon fin raised from the semiconductor substrate. The channel of the device is formed in the fin, and a gate is provided over (e.g., surrounding) the fin—for example, in contact with the top and the sidewalls of the fin. The gate surrounding the channel (e.g., fin) is beneficial in that allows control of the channel from three sides.

The conventional finFET design may not be feasible to provide a native transistor (e.g., a native finFET NMOSFET) however. The thin channel of a conventional finFET device may be fully depleted. The threshold voltage is controlled by the work function of the gate. Thus, channel doping may be unable to sufficiently modify the threshold voltage of a fin-FET device. Therefore, there are difficulties in providing a native device (e.g., a device having an approximately zero volt threshold voltage) using a conventional finFET design.

Therefore, what is needed is a transistor structure and method of fabrication compatible with finFET devices and processes.

SUMMARY

Figure 1:
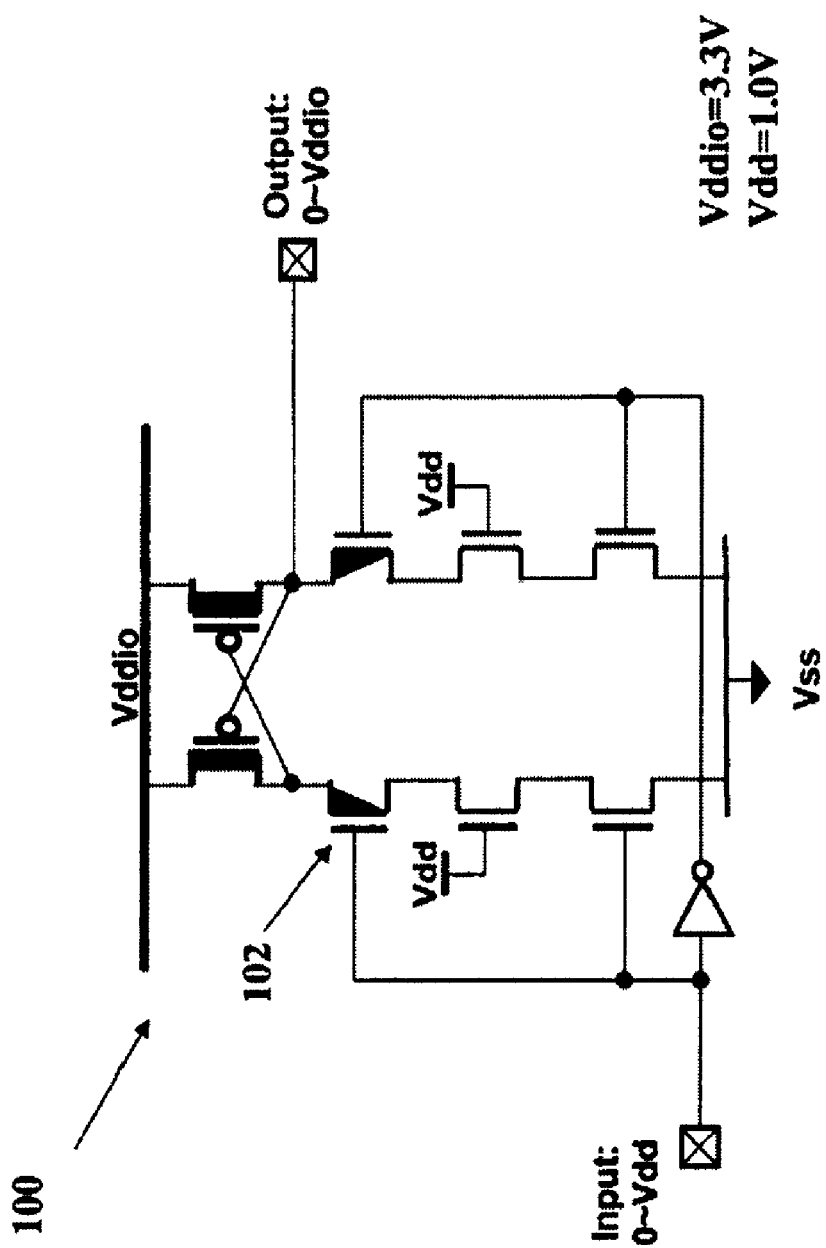
FIG. 1 is a circuit diagram illustrating an embodiment of a circuit including a native device.

A semiconductor device is provided. The device includes a substrate having a fin extending from the surface of the substrate. A gate is provided over a channel portion of the fin. The gate interfaces (e.g., contacts) with the channel portion of the fin only on a top surface of the channel portion. A source region is disposed on a first end of the fin. The source region includes an epitaxial grown region on the first end of the fin. A drain region is disposed on a second end of the fin. The drain region includes an epitaxial grown region on the second end of the fin.

A method of fabricating a semiconductor device is provided. The method includes providing a substrate. A first and second fin are formed on the substrate. A space interposes the first and second fin. An isolation structure is formed in the space. The isolation structure is formed by filling the space with isolating material and forming a planar surface including a top surface of the isolation structure and a top surface of the first and second fin. A gate structure is formed on the planar surface of the center region of the first fin. The gate structure is a top-channel only structure.

In another embodiment, a method of fabricating a semiconductor device is provided. The begins by providing a substrate including a plurality of fins. Insulating material is deposited on the substrate between the fins. A masking element is formed over a center portion of the fins and deposited insulating material. Recesses are created in the deposited insulating material while using the masking element to protect the center portion of the fins and deposited insulating material. A source/drain region are formed in the created recess. The masking element is removed after creating the recesses. A gate structure is then created over the center portion of the fins and deposited insulating material.

DETAILED DESCRIPTION

The present disclosure relates generally to forming an integrated circuit device and, more particularly, a transistor including a top channel only finFET-compatible device that may provide a native transistor. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals in the various examples. This repetition is for the purpose of simplicity and clarity and does not in itself dictate a relationship between the various embodiments and/or configurations discussed. Furthermore, included are descriptions of a first layer or feature "on" or "overlying" (as well as similar descriptions) a second layer or feature. These terms include embodiments where the first and second layer are in direct contact and those where one or more layers or feature are interposing the first and second layer. In addition, descriptive terms such as "top" and "bottom" are intended to describe a relative relationship only and not intended to provide an absolute direction. Further still, though described herein as providing methods and structures associated with native devices, other semiconductor devices may benefit from the present disclosure.

Referring to FIG. 1, illustrated is a circuit 100 including a low Vccmin design. The circuit 100 includes a native field effect transistor (FET) 102. In an embodiment, the native FET 102 includes an NMOSFET. The circuit 100 may be useful in memory, microprocessor, and/or other designs. The circuit 100 is intended to be exemplary only, and not limiting in any manner.

Figure 2:
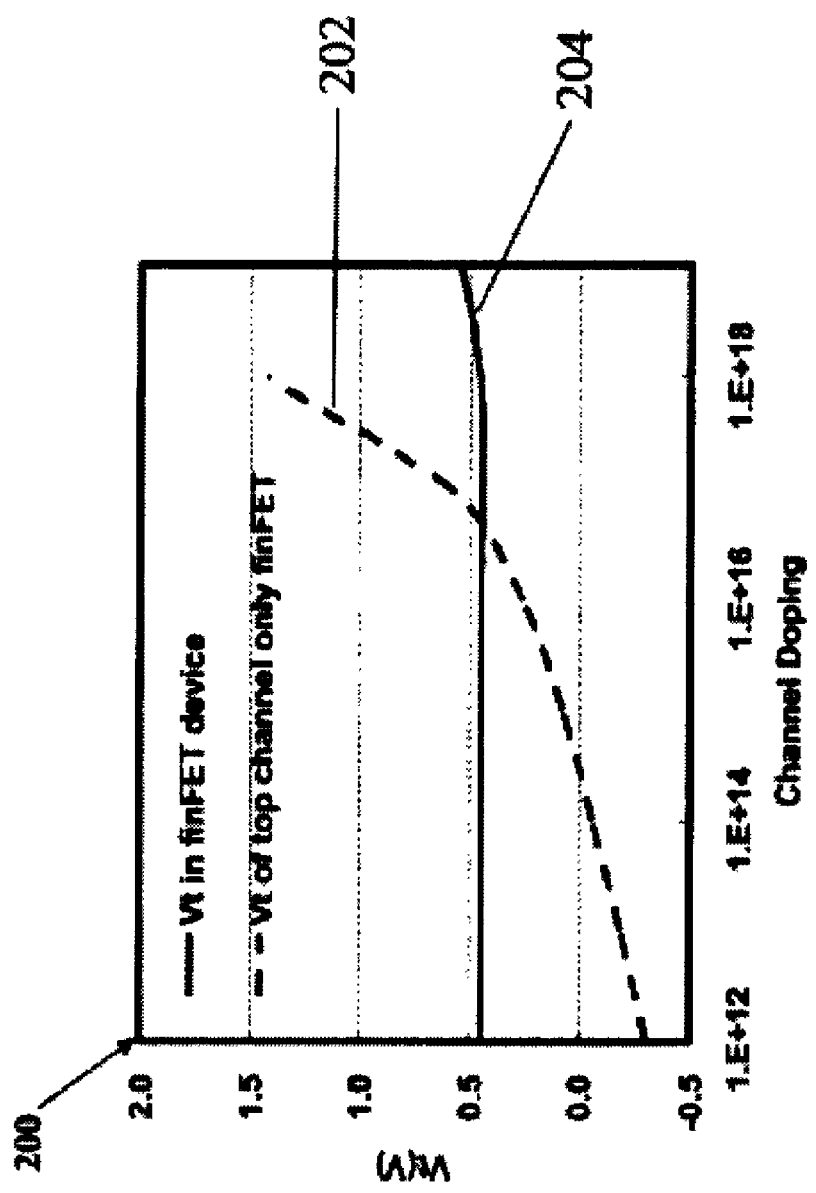
FIG. 2 is a graph illustrating an embodiment of threshold voltage versus channel doping for a conventional finFET device and a "top channel only" finFET-compatible device.

Referring now to FIG. 2, provided is a graph 200 illustrating channel doping versus threshold voltage (Vt) of two devices. A conventional finFET device (e.g., including a gate surrounding the channel on multiple sides) is illustrated as line 202. A top-channel only finFET-compatible device (e.g., a gate is only provided on the top surface of the fin including the channel of the device, thus the gate is controlled on only one side) is illustrated as line 204. The top-channel only finFET-compatible device may be fabricated using the method 300, described with reference to FIG. 3, and/or may include the device 1200, described with reference to FIGS. 12, 13, and 14. Graph 200 illustrates that the top-channel only finFET-compatible device provides a threshold voltage of approximately zero volts for a channel doping of approximately 1E15 (atoms/cm$^2$). In contrast, the conventional finFET-compatible device does not provide a channel doping that produces a threshold voltage of zero. Thus, the graph 200 illustrates an advantage of the top-channel only finFET-compatible device as it provides an ability to produce a native (~0V threshold voltage) device.

Figure 3:
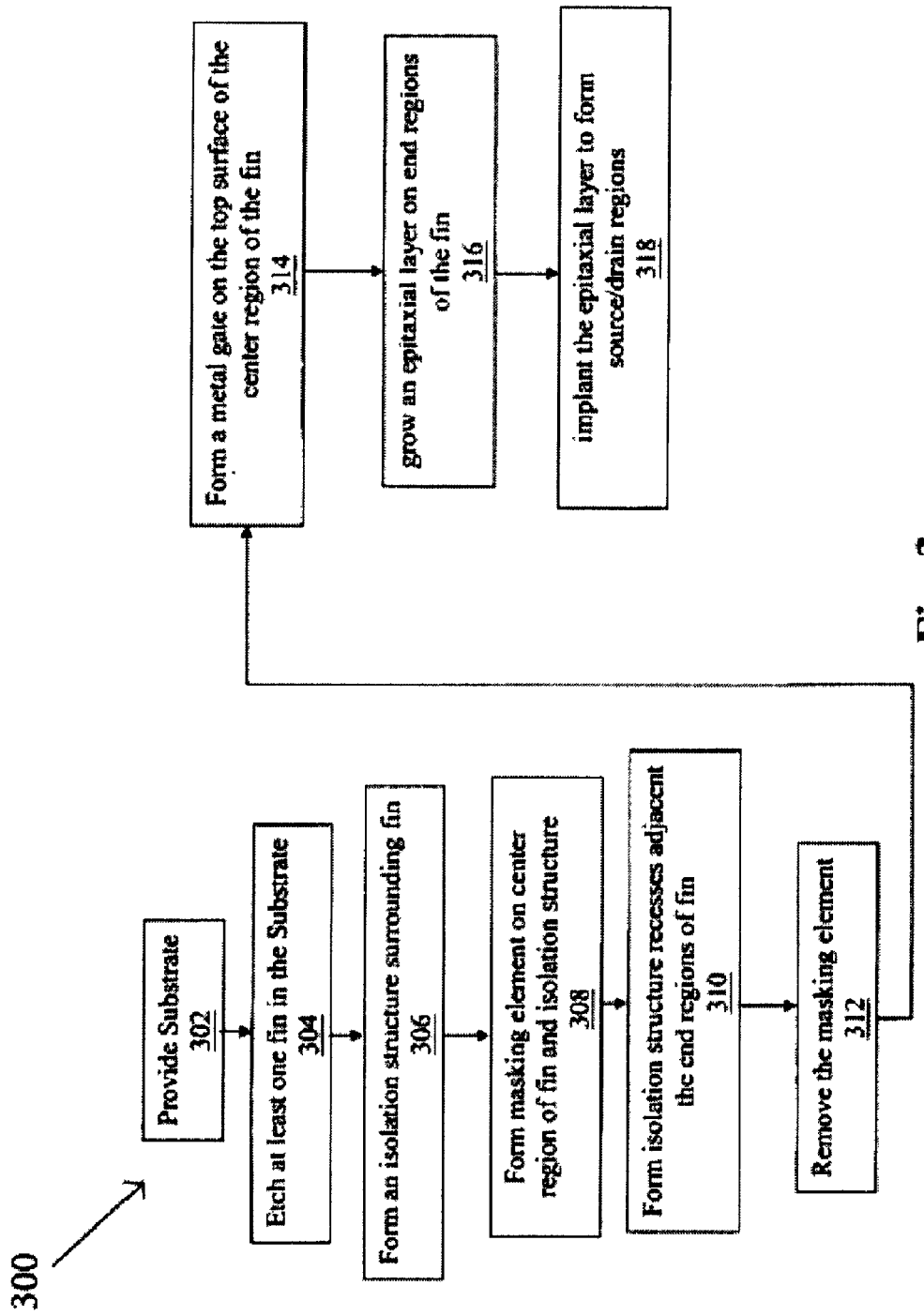
FIG. 3 is a flowchart illustrating an embodiment of fabricating a native transistor using a finFET compatible process flow.
Figure 4:
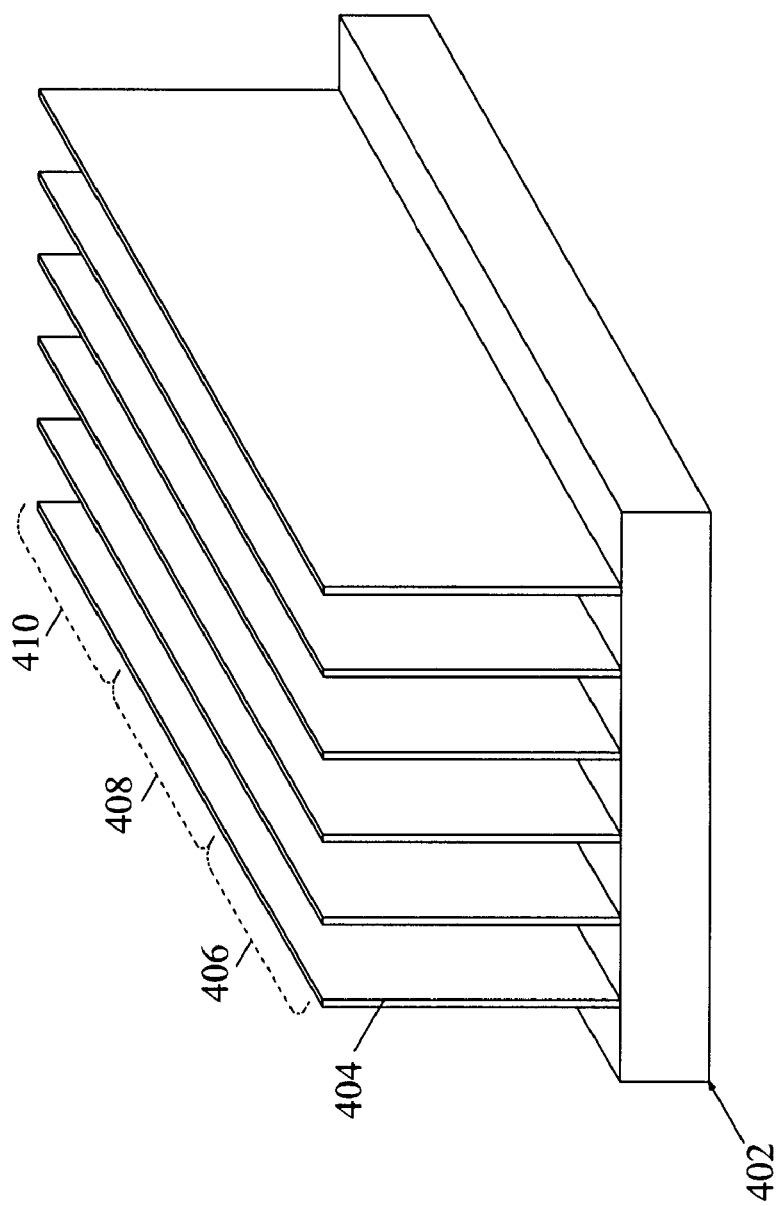
FIGS. 4, 5, 6, 7, 8, 9, 10, and 11 are perspective views of a device corresponding to the steps of the method of FIG. 3.

Referring now to FIG. 3, illustrated is a method 300 for fabricating a native device using a process compatible with a finFET fabrication process. The method 300 may also be used to fabricate a top-channel only device using a finFET-compatible fabrication process. The method 300 begins at step 302 where a substrate (e.g., semiconductor wafer) is provided. Referring to the exemplary embodiment of FIG. 4, the substrate 402 is provided. In an embodiment, the substrate 402 includes a silicon substrate in crystalline structure. Other elementary semiconductors such as germanium and diamond may also be included. Alternatively, the substrate 402 may include a compound semiconductor such as, silicon carbide, gallium arsenide, indium arsenide, or indium phosphide. Further, the substrate 402 may optionally include a silicon-on-insulator (SOI) structure.

The method 300 then proceeds to step 304 where a fin is formed in the substrate. A plurality of fins may be formed. The fins may be formed using processes such as, deposition, photolithography, wet etching, dry etching (e.g., reactive ion etch (RIE)), plasma etching, and/or other suitable processes. The fins may include semiconductor material such as silicon, silicon germanium, and/or other suitable materials including those discussed above with reference to the substrate 402. In an embodiment, the fins are formed by etching an SOI layer of the substrate. Referring to the example of FIG. 4, a plurality of fins 404 are provided. The fins 404 include a center portion 408, a first end portion 406 and a second end portion 410. The center portion 408 may correspond to the region of the fin 404 where a channel will be formed. The end portions 406 and 410 may correspond to the region of the fin 404 where source/drain region(s) will be formed.

Figure 5:
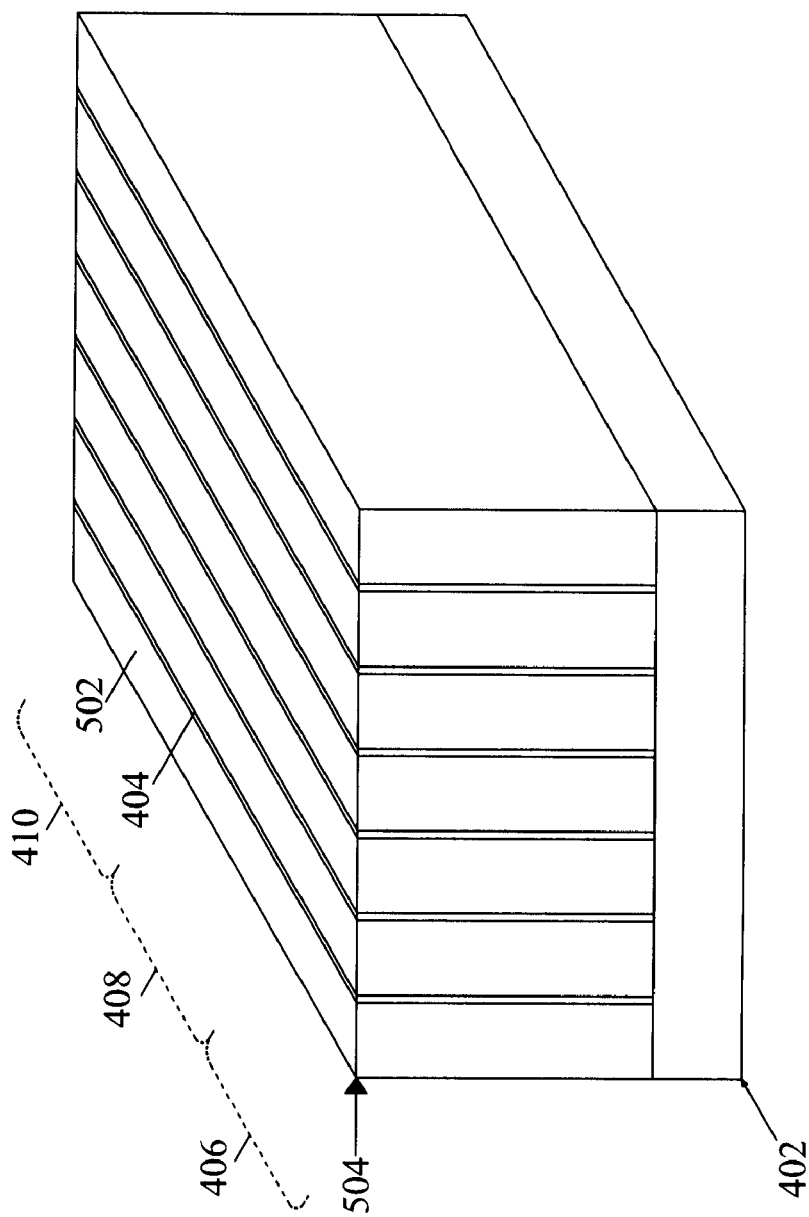

The method 300 then proceeds to step 306 where isolation features are formed adjacent the fin. The isolation features may substantially fill the region(s) between the fins. The isolation features may provide a substantially planar top surface of the device. For example, the top surface of the isolation features and the top surface of the plurality of fins may be co-planar and provide a single planar surface on the substrate. The isolation features may be formed by filling the region between the fins with insulating material and performing a chemical mechanical polish (CMP) process to planarize the surface. The isolation features may be referred to as shallow trench isolation (STI) features. Referring to the example of FIG. 5, STI features 502 are formed between the fins 404 such that a planar surface 504 is formed. The STI features 502 may include an insulating material. Example insulating materials include silicon oxide, silicon nitride, silicon oxynitride, fluoride-doped silicate glass (FSG), a low-k dielectric material, and/or other suitable compositions.

Figure 6:
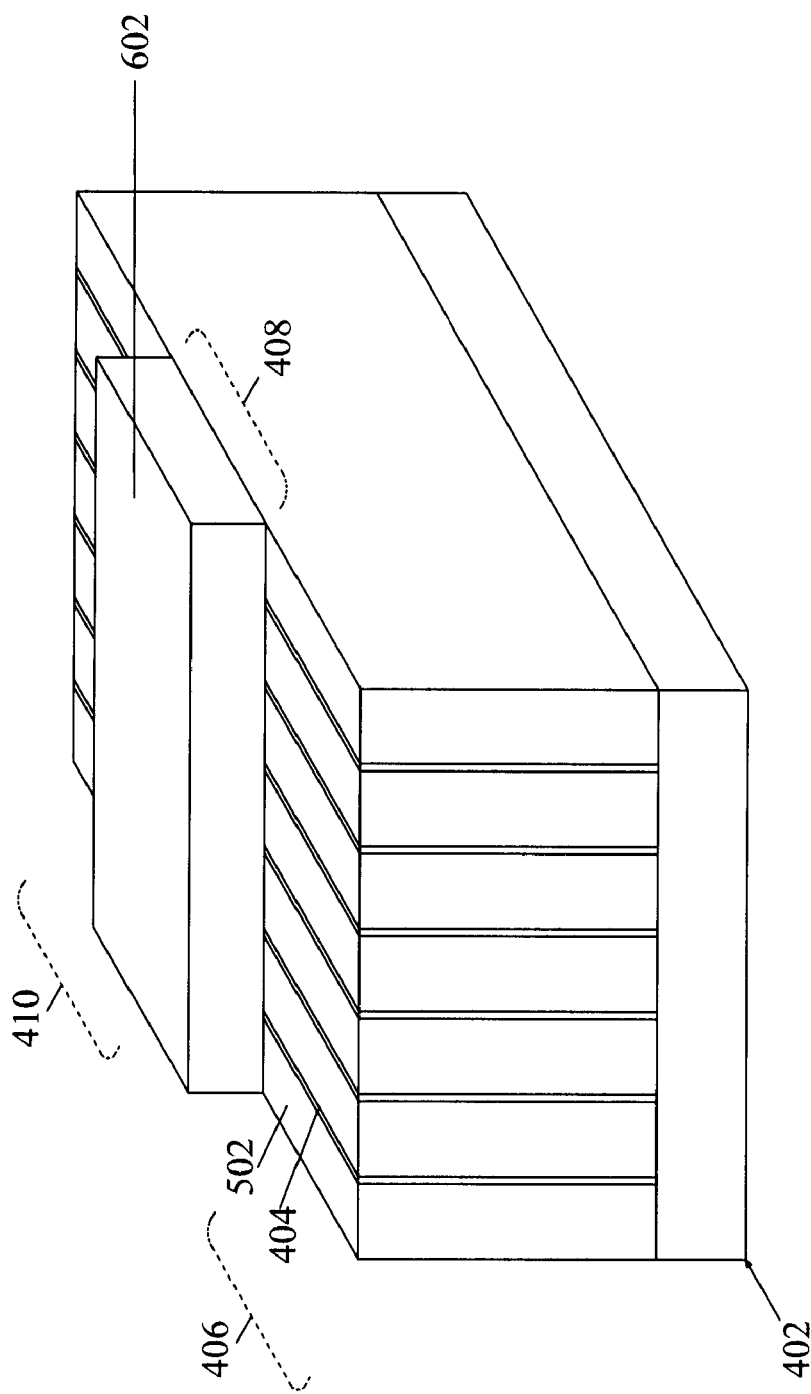

The method 300 then proceeds to step 308 where a masking element is formed on the center region of the fin(s). The masking element may be used to mask (e.g., protect) a portion of the substrate including the fins and isolation structures during subsequent processing. The masking element may include photoresist, hard mask, and/or other suitable materials. The masking element may be formed by depositing photoresist (e.g., spin-on deposition). Photolithography processes may be used to pattern the photoresist layer such as bake, exposure, and development processes known in the art. The masking element may be formed overlying the region of the fin where a gate will be subsequently formed (e.g., center portion) while leaving exposed the regions of the fins where a source/drain will be formed (e.g., end portions). Referring to the example of FIG. 6, a masking element 602 is formed on the substrate 402 and in particular, overlying the STI 502 and fins 404. The masking element 602 is formed over the center region 408 of the fins 404 and adjacent STI 502 (e.g., the center portion of the STI 502). The masking element 602 may include photoresist.

Figure 7:
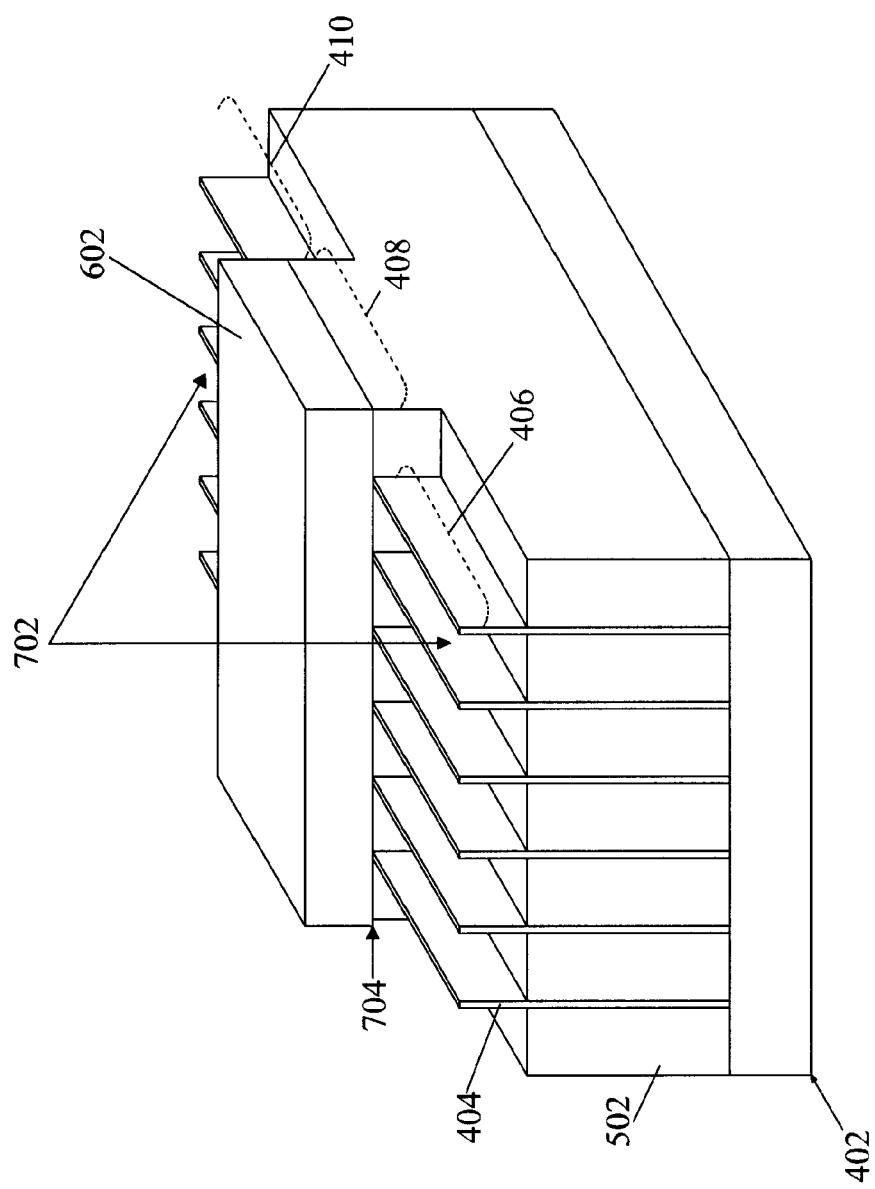

The method 300 then proceeds to step 310 where portions of the isolation features are removed to form recesses adjacent the end regions of the fins. The recesses define a region where a source/drain will be formed. The isolation features may be removed using wet etch, dry etch, plasma etching, and/or other suitable processes. Referring to the example of FIG. 7, portions of the STI features 502 are removed to expose a portion of the sidewalls of the fins 404 at the end regions 406 and 410. The removal of a portion of the STI features 502 creates STI recesses 702 between the fins 404. The masking element 602 masks (e.g., protects) the center region 408, including the center portion of the fins 404 and the STI features 502 from being removed. A planar surface 704 remains in the center portion 408, underlying the masking element 602.

Figure 8:
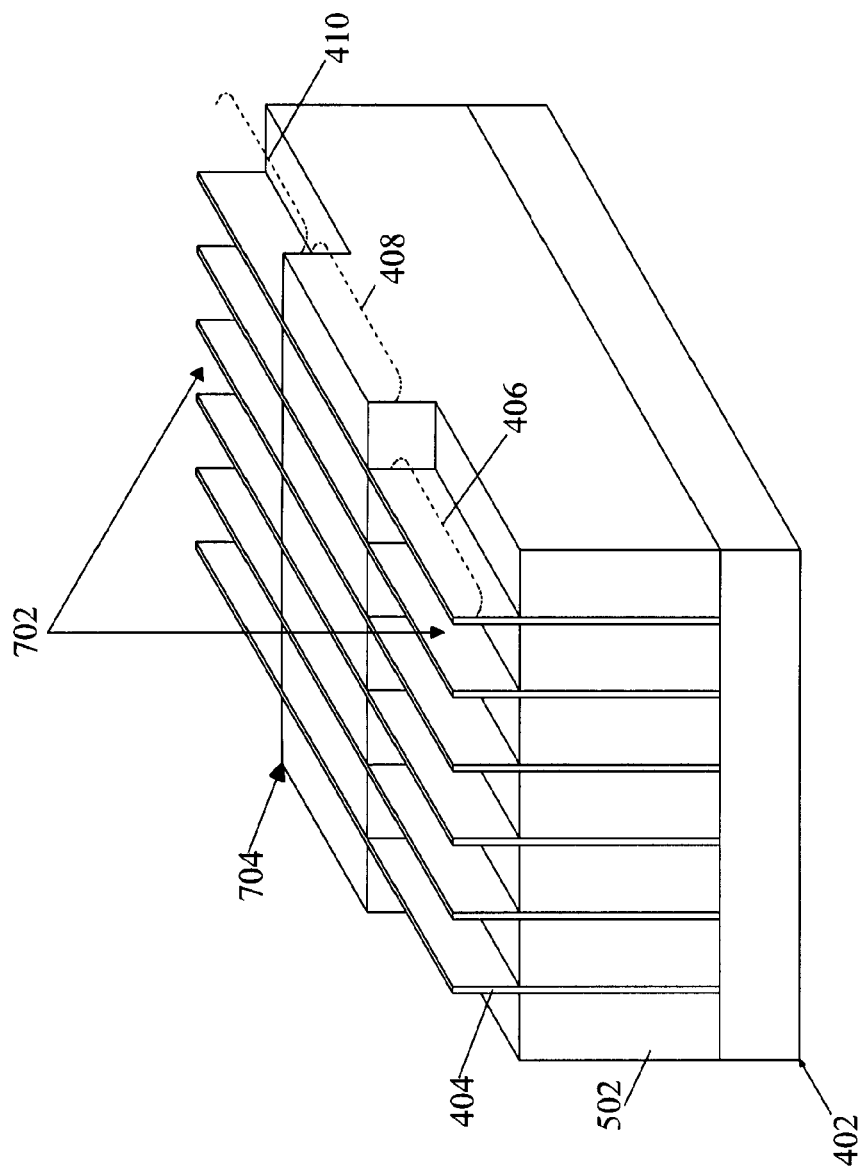

The method 300 then proceeds to step 312 where the masking element is removed from the substrate. The masking element may be removed using wet etch or stripping, dry etch, plasma etch, and/or other suitable processes. Referring to the example of FIG. 8, the masking element 602 has been removed. The top surface 704 of the center portion 408 of the fins 404 is unmasked. The STI 502 abut the sidewall of the fins 404 at the center portion 408 (thereby providing the top surface 704).

The method 300 then proceeds to step 314 where a gate is formed on the top surface of the center region (e.g., channel region) of a fin. The gate may be such that it includes a direct interface to the top surface of the fin, but does not contact the sidewalls of the fin. In other words, the gate provides a top channel only device (e.g., controls the channel from one side only—top surface). This is in contrast to a conventional finFET device, which would provide a contact between the gate and the fins at the top surface as well as the sidewalls of the fins. In an embodiment, the gate is a metal gate. The gate may include a high-k gate dielectric and/or a metal gate electrode. A metal gate may be formed using a "gate first" or a "gate last" (e.g., process including formation of a sacrificial polysilicon gate).

Figure 9:
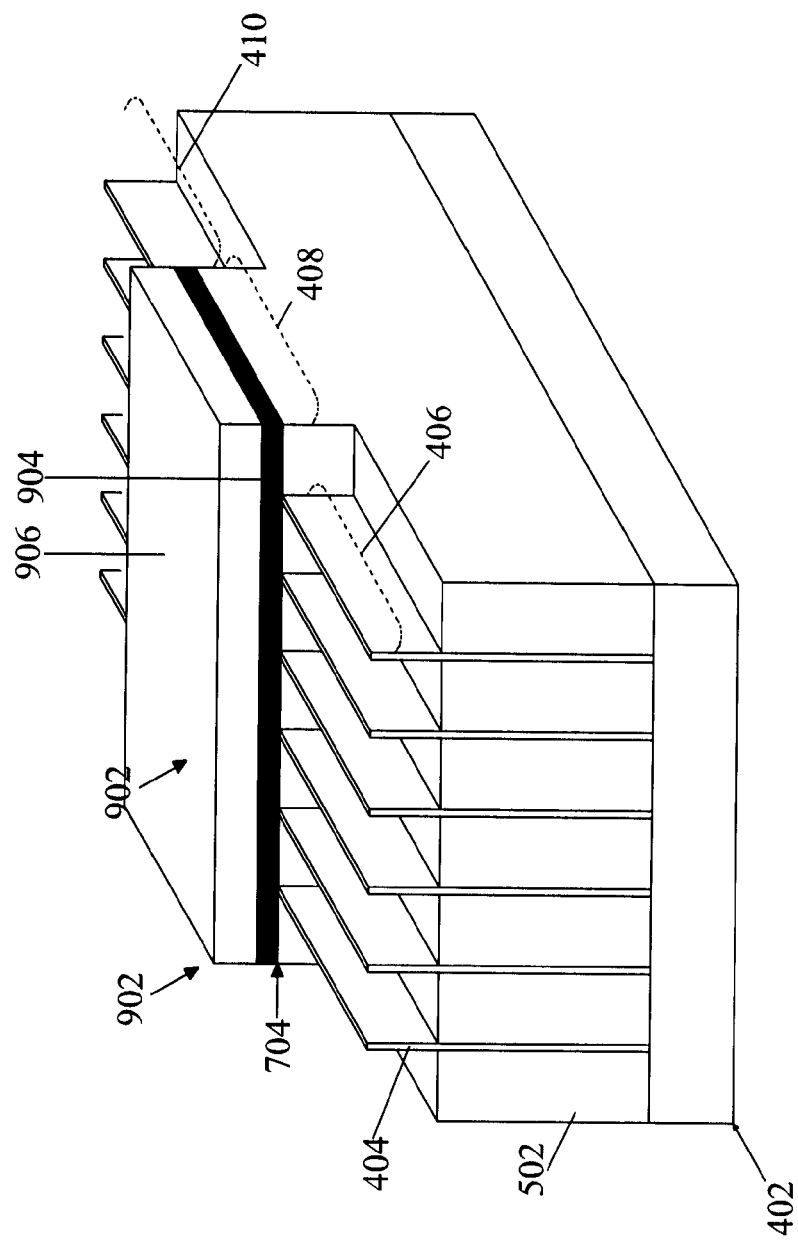

Referring to the example of FIG. 9, a gate structure 902 is formed on the substrate 402, in particular on the planar surface 704. The gate structure 902 is formed on the center region 408. The gate structure 902 overlies the center region 408 of the fins 404, as well as the STI features 502. The gate structure 902 may include an interface with the surface 704 only, and not include a direct interface with the sidewalls of the fins 404. For example, the gate structure 902 does not abut the sidewalls of the fins 404 at the center region 408 as the sidewalls at the center region 408 are abutting the STI features 502. Thus the gate structure 902 and the underlying center portion 408 of the fin 404 (channel) illustrate a gate region of a top-channel only device.

The gate structure 902 includes a gate dielectric 904 and a gate electrode 906. In embodiments, one or more additional layers may be included in the gate structure 902 including, for example, capping layers, interface layers, and/or other suitable layers. The gate dielectric layer 904 may include a high-k material (e.g., a material including a "high" dielectric constant, as compared to silicon oxide). Examples of high-k dielectrics include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The gate dielectric layer 904 may include a plurality of layers. The gate dielectric layer 904 may be formed by ALD, chemical vapor deposition (CVD), and/or other suitable processes.

The metal gate electrode 906 may include one or more layers including Ti, TiN, TaN, Ta, TaC, TaSiN, W, WN, MoN, MoON, $RuO_2$, and/or other suitable materials. The metal gate electrode 906 may include one or more layers formed by physical vapor deposition (PVD), CVD, ALD, plating, and/or other suitable processes. In an embodiment, the metal gate electrode 906 includes a work function metal layer such that it provides an N-metal work function or P-metal work function of a metal gate. P-type work function materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

Figure 10:
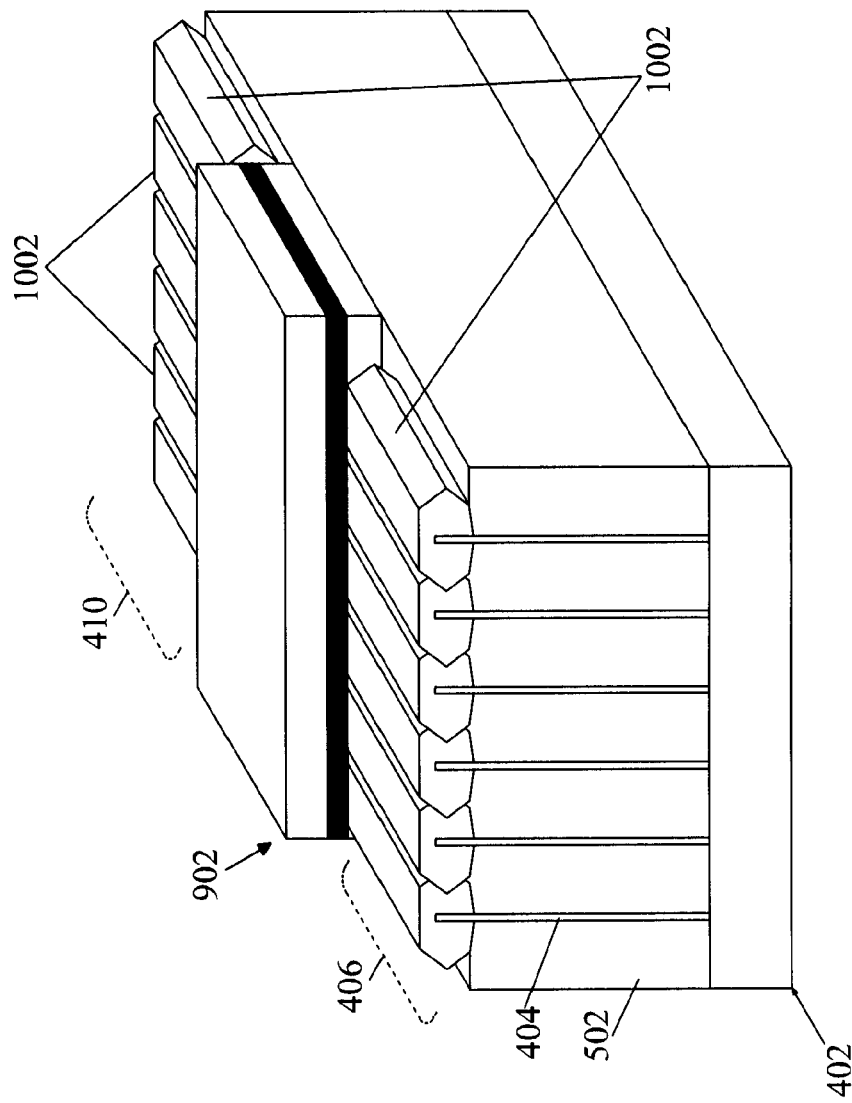

Referring again to FIG. 3, the method 300 then proceeds to step 316 where an epitaxial layer is grown on the end regions of the fin(s) (e.g., adjacent the center (e.g., channel region)). The epitaxial layer may include epitaxial silicon, epitaxial silicon germanium, and/or other suitable epi materials. The epitaxial layer provides a region for the formation of a source/drain. The epitaxial layer may be grown using suitable processes including using liquid or vapor precursors and the fin as a seed material to grow the region (e.g., vapor-phase epitaxy (VPE), liquid phase epitaxy (LPE)). Referring to the example of FIG. 10, epitaxial regions 1002 are formed. The epitaxial regions 1002 are formed at each of the end regions 406 and 410 of the fins 404. In an embodiment, the epitaxial regions 1002 include epitaxial silicon.

Figure 11:
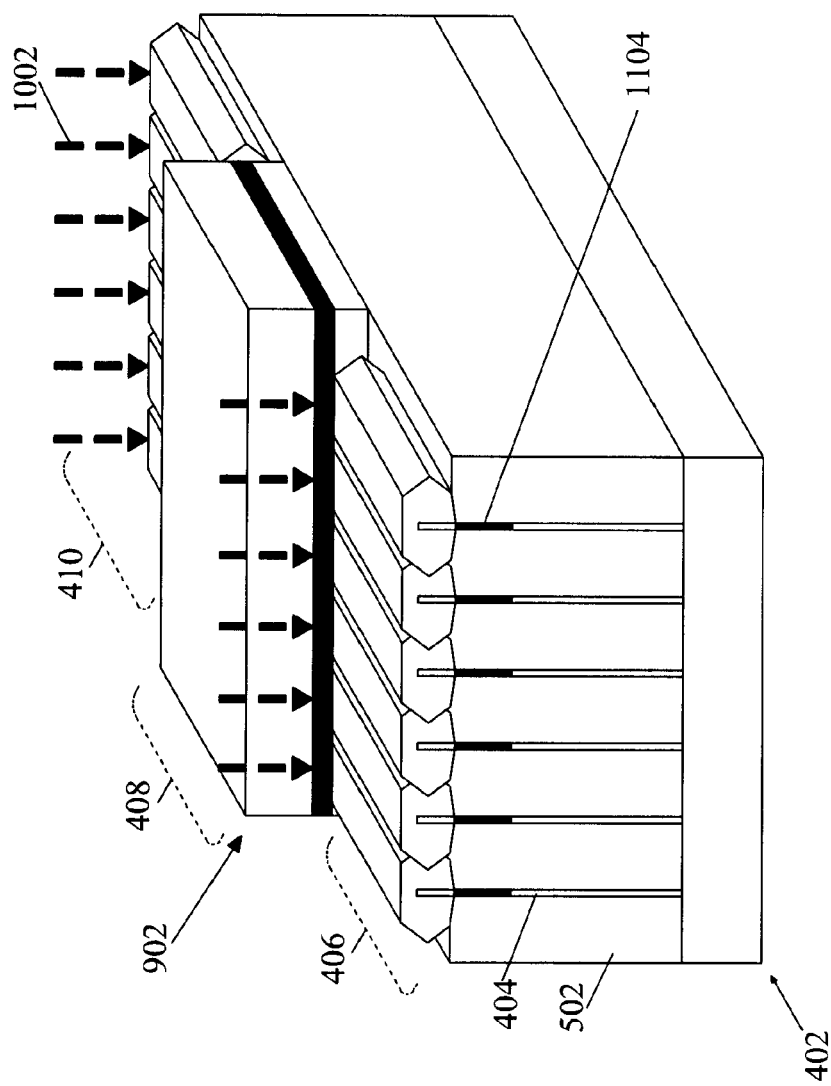

The method 300 then proceeds to step 318 where the epitaxial regions are doped to provide source/drain regions. The source/drain regions may be formed by implanting p-type or n-type dopants depending on the desired transistor configuration. In an embodiment, an n+ implant forms a source/drain region associated with an NMOSFET device. Referring to the example of FIG. 11, an implant 1102 is performed. The implant 1102 provides dopants to the epitaxial regions and/or a portion of the fins 404 to provide source/drain regions 1104. In an embodiment, the implant 1102 includes an n+ implant such as phosphorus, arsenic, antimony, or other suitable dopant. The n+ implant provides for an n-doped source/drain region 1104.

Thus, illustrated is a method 300 which provides a method of fabricating a top-channel only device using a finFET-compatible process. The top-channel only device provides a gate structure, such as gate structure 902, on a channel region of a fin, such as center region 408 of the fin 404. The gate structure is provided only on the top surface of the fin. The sidewalls of the channel region of the fin abut isolation features. The top-channel only device may be useful in providing a native device using a finFET compatible process flow. This would allow an integrated circuit to be fabricated which includes native devices and conventional (multi-gate) finFET devices using compatible process flows.

Figure 12:
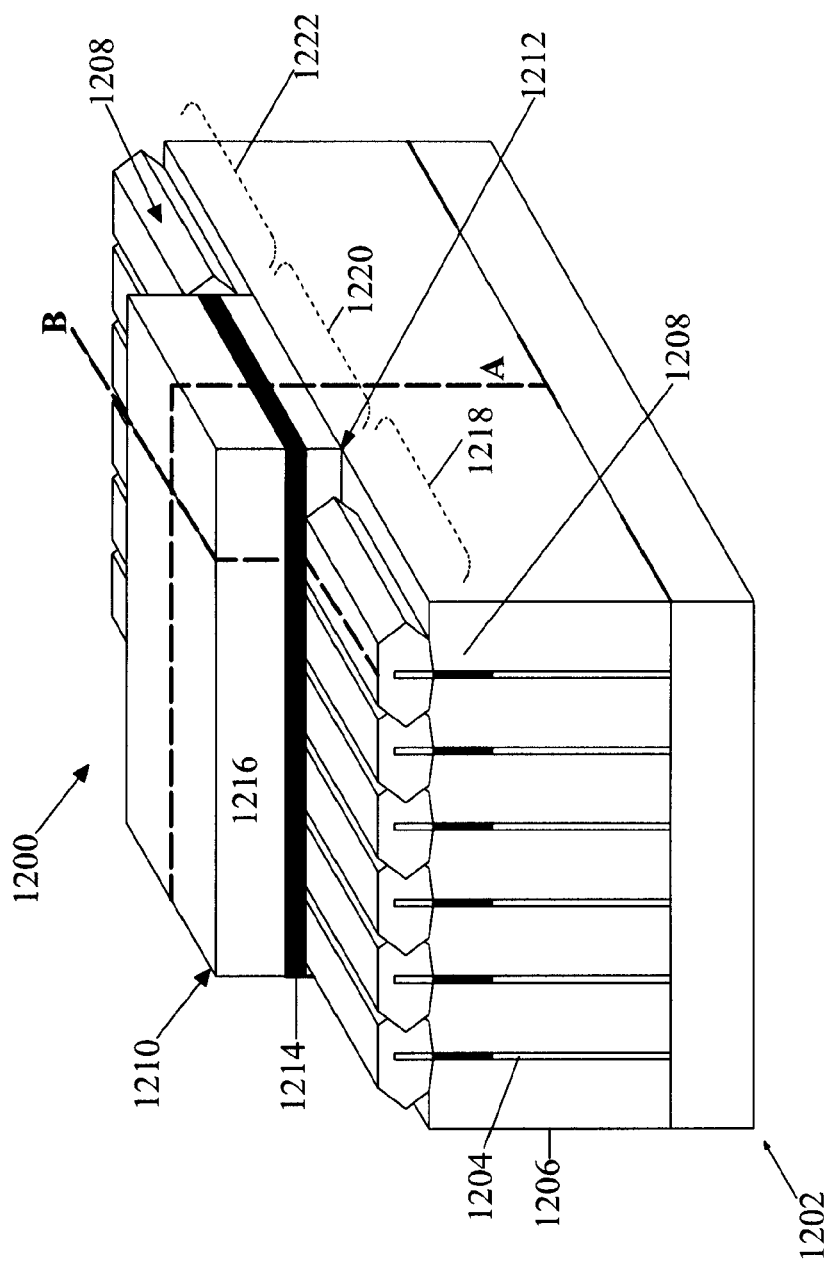
FIGS. 12, 13, and 14 are perspective and cross-sectional views of a top-channel only finFET-compatible device.
Figure 14:
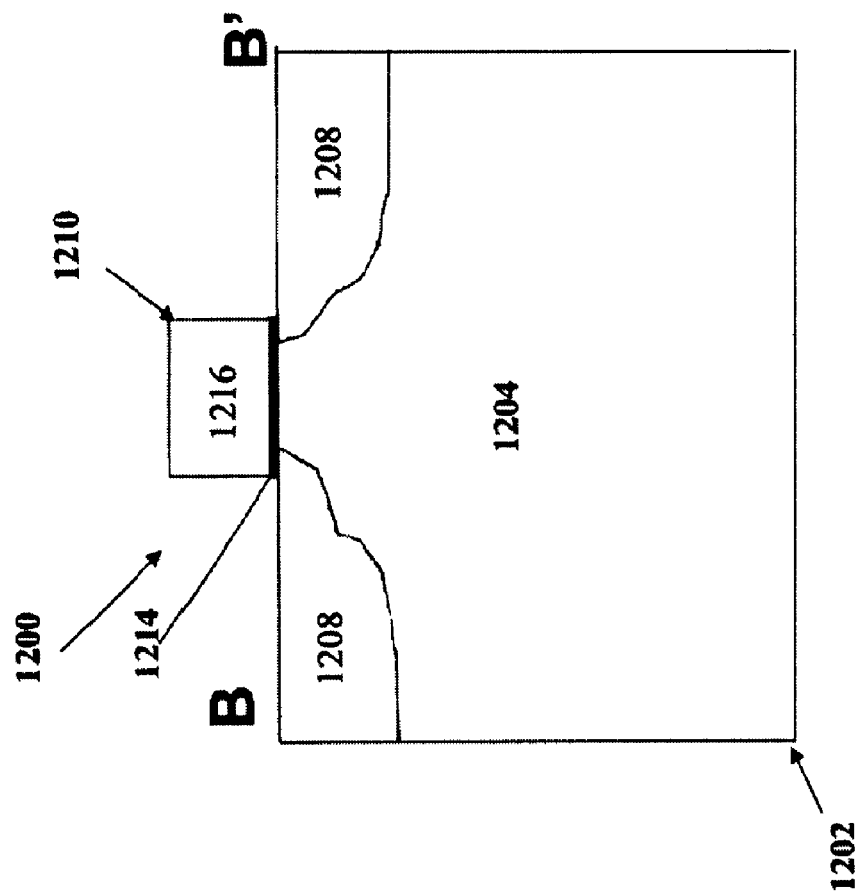
Figure 13:
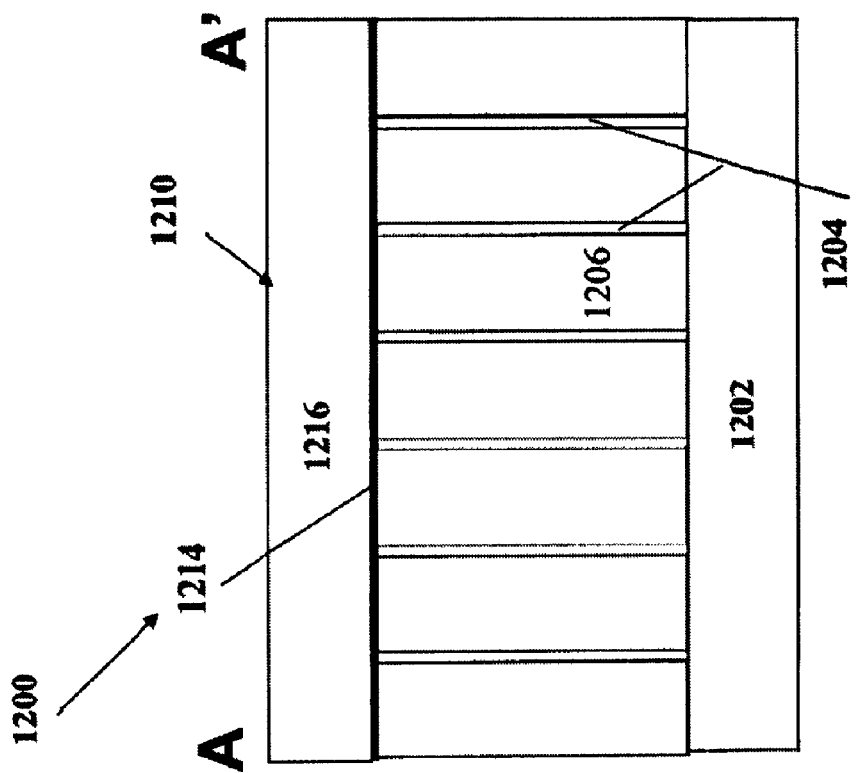

Referring now to FIGS. 12, 13, and 14, illustrated is a semiconductor device 1200. The semiconductor device 1200 may be a native device. The semiconductor device 1200 includes a top-channel only finFET-compatible device, the gate being formed only on the top of a fin including the channel of device.

The device 1200 includes a substrate 1202, fins 1204, isolation features 1206 interposing the fins 1204, source/drain regions 1208 formed on the fins 1204, and a gate structure 1210 overlying the fins 1204. The substrate 1202 may be substantially similar to the substrate 402, described above with reference to FIG. 4. The fins 1204 may be substantially similar to the fins 404, also described above with reference to FIG. 4. Each of the plurality of fins 1204 include a center portion 1220 and two end portions 1218 and 1222. The center portion 1220 may correspond with a channel of a device associated with the fin 1204. Source and drain regions 1208 are provided at the end portions 1218 and 1222 of the fins 1204. The source and drain regions 1208 may be substantially similar to source and drain regions 1104, described above with reference to FIG. 11. For example, the source and drain regions 1208 may include doped regions of an epitaxial layer grown from the fins 1204. The source and drain regions 1208 also include a doped region of the fin 1204 itself. The source and drain regions 1208 are formed in recesses 1212 of the isolation features 1206. In an embodiment, the device 1200 is a native NMOSFET device. In the embodiment, the source and drain regions 1208 include n-type dopants.

The center portion 1220 of the fins 1204 form a channel region. Overlying the center portion 1220 is the gate structure 1210. The gate structure 1210 may be substantially similar to the gate structure 902, described above with reference to FIG. 9. The gate structure 1210 includes a gate dielectric layer 1214 and a gate electrode 1216. Numerous embodiments of the gate structure 1210 may be possible including, for example, additional capping layers, interface layers, electrode layers, dielectric layers, and/or other suitable layers. In an embodiment, the gate dielectric layer 1214 includes a high-k dielectric material. The gate dielectric layer 1214 may be substantially similar to the gate dielectric layer 904, described above with reference to FIG. 9. In an embodiment, the gate electrode 1216 includes a metal gate electrode. The gate electrode 1216 may be substantially similar to the gate electrode 906, also described above with reference to FIG. 9. The gate structure 1210 contacts only the top of the channel.

In embodiments, the device 1200 may further include spacers, lightly doped source/drain regions, contacts, interconnects and/or other suitable features. The semiconductor device 1200 may provide benefits over conventional devices such as, being a native device including a finFET-compatible structure (e.g., including a channel formed on a fin).

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a semiconductor device, comprising:
providing a substrate;
forming a first and second fin on the substrate, wherein a space interposes the first and second fin;

forming an isolation structure in the space, wherein the forming the isolation structure includes filling the space with isolating material that abuts the lateral sides of each of the first and second fins adjacent the top surface of each of the first and second fins forming a planar surface, wherein the planar surface includes a top surface of the isolation structure and a top surface of the first and second fin;

forming a gate structure on the planar surface including the top surface of the isolation structure, the top surface of the first fin, and the top surface of the second fin, wherein the gate structure includes a top-channel only gate structure;

removing portions of the isolation structure, wherein the removed portions of the isolation structure provide recesses adjacent an end region of the first and second fin; and forming a source or drain region in the recesses.

2. A method of fabricating a semiconductor device, comprising:

providing a substrate including a plurality of fins;

depositing insulating material on the substrate between the fins;

forming a masking element over a center portion of the fins and deposited insulating material;

creating recesses in the deposited insulating material while using the masking element to protect the center portion of the fins and deposited insulating material;

forming a source/drain region in the created recess;

removing the masking element after creating the recesses; and forming a gate structure having a planar bottom surface over the center portion of the fins and deposited insulating material, such that the planar bottom surface interfaces with the plurality of fins and with the deposited insulating material, wherein the insulating material abuts the lateral surface of each of the plurality of fins and the gate abuts the top surface of each of the plurality of fins.

3. A method comprising:

forming a plurality of fins interposed by insulating material on a semiconductor substrate, wherein the plurality of fins and insulating material have a co-planar top surface and wherein the insulating material abuts the lateral surfaces of each of the plurality of fins and extends to the co-planar top surface;

forming a gate structure on the co-planar top surface such that a planar bottom surface of the gate structure interfaces with each of the plurality of fins and with the insulating material;

removing portions of the insulating material, wherein the removed portions of the isolation material provide recesses adjacent an end region of each of the plurality of fins; and forming a source or drain region in the recesses.

4. The method of claim 1, wherein the forming the gate includes forming a first layer of the gate directly on the planar top surface including the fin and the isolation structure.

5. The method of claim 2, wherein the forming the masking element includes depositing a photoresist layer and patterning the photoresist layer.

6. The method of claim 2, wherein the forming the gate structure includes forming a gate dielectric layer including a high-k dielectric material.

7. The method of claim 2, wherein the forming the gate structure includes forming a metal gate.

8. The method of claim 2, wherein the depositing the insulating material includes chemical mechanical polishing the deposited insulating material, wherein the polished insulating material includes a top surface planar with a top surface of the plurality of fins.

9. The method of claim 2, wherein the forming the source/drain region in the recess includes growing an epitaxial layer on the fins and implanting the epitaxial layer.

10. The method of claim 2, wherein the center portion of the fin provides a channel region for a native transistor.

11. The method of claim 2, wherein the providing the substrate includes providing a semiconductor substrate and etching the plurality of fins in the substrate.

12. The method of claim 2, wherein the creating recesses includes etching the isolating material to provide a first thickness adjacent an end of the fins and a second thickness adjacent the center of the fins, wherein the first thickness is less than the second thickness.

13. The method of claim 3, further comprising: forming a source/drain region in each of the recesses including growing an epitaxial layer on the fins and implanting the epitaxial layer.

14. The method of claim 3, wherein the forming the plurality of fins interposed by insulating material includes depositing the insulating material and chemical mechanical polishing the deposited insulating material to form the co-planar top surface.

15. The method of claim 3, wherein the gate structure is formed directly on the co-planar top surface.

* * * * *